(12) United States Patent
Crane, Jr. et al.

(10) Patent No.: US 6,603,193 B2
(45) Date of Patent: Aug. 5, 2003

(54) SEMICONDUCTOR PACKAGE

(75) Inventors: Stanford W. Crane, Jr., Santa Clara, CA (US); Myoung-Soo Jeon, Fremont, CA (US); Vicente D. Alcaria, Richmond, CA (US)

(73) Assignee: Silicon Bandwidth Inc., Fremont, CA (US)

( * ) Notice: Subject to any disclaimer, the term of this patent is extended or adjusted under 35 U.S.C. 154(b) by 0 days.

(21) Appl. No.: 09/946,682

(22) Filed: Sep. 6, 2001

(65) Prior Publication Data

US 2003/0042596 A1 Mar. 6, 2003

(51) Int. Cl.[7] .................. H01L 23/055; H01L 23/10; H01L 23/60
(52) U.S. Cl. .................. 257/659; 257/660; 257/697; 257/710; 257/724; 257/728
(58) Field of Search ................. 257/659, 660, 257/697, 710, 724, 725, 728

(56) References Cited

U.S. PATENT DOCUMENTS

| | | | |
|---|---|---|---|
| 5,151,769 A | * | 9/1992 | Immorlica et al. .......... 257/659 |
| 5,194,695 A | | 3/1993 | Maslakow |
| 5,248,901 A | | 9/1993 | Temple |
| 5,285,107 A | * | 2/1994 | Kazami et al. ............. 257/678 |
| 5,350,713 A | | 9/1994 | Liang |
| 5,572,065 A | | 11/1996 | Burns |
| 5,574,314 A | * | 11/1996 | Okada et al. ................ 257/659 |
| 5,650,659 A | * | 7/1997 | Mostafazadeh et al. ..... 257/659 |
| 6,227,724 B1 | | 5/2001 | Verdiell |
| 6,365,960 B1 | * | 4/2002 | Pollock et al. ......... 174/35 GC |

OTHER PUBLICATIONS

Patent application Ser. No. 09/946,553, filed Sep. 6, 2001, Crane, Jr., et al.
Patent application Ser. No. 09/946,554, filed Sep. 6, 2001, Crane, Jr., et al.
Patent application Ser. No. 09/940,649, filed Aug. 29, 2001, Crane, Jr., et al.

* cited by examiner

Primary Examiner—Jerome Jackson
(74) Attorney, Agent, or Firm—McKenna Long & Aldridge

(57) ABSTRACT

A semiconductor package having a molded body and a plurality of conductive pins that extend from the bottom of the molded body. The semiconductor package further includes a RF shield around a protected cavity that holds a first integrated circuit. The molded body can further include an unprotected plastic cavity for holding a second integrated circuit. The conductive pins form bonding pads that are used to electrically interconnect the first and second semiconductor devices to the external environment. A cover, beneficially comprised of copper, is disposed over the molded body. The plastic cavity beneficially includes a beveled wall that improves the routing of electrical conductors between the first integrated circuit and the second integrated circuit.

47 Claims, 8 Drawing Sheets

SEMICONDUCTOR PACKAGE

BACKGROUND OF THE INVENTION

1. Field of the Invention

The present invention relates to semiconductor packages. More particularly, the present invention relates to semiconductor packages having a cavity.

2. Background of the Invention

Modern electronic devices, for example cellular phones and pagers, require a seamless integration of analog and digital subsystems. Furthermore, premiums are often placed on small size, complexity, and high performance. Thus, highly sensitive analog circuits frequently need to be placed very close to high-speed digital systems.

High-speed digital systems can switch more then one hundred million times a second. At such switching speeds, switching currents tend to be high. Thus, such high-speed digital systems can radiate energy that interferes with highly sensitive analog circuits. Interference usually takes the form of signal crosstalk. While faraday shielding has been widely used to protect highly sensitive analog circuits from interference, the traditional faraday shields tend to be expensive. Furthermore, their implementation must be undertaken with great foresight to determine where to install the shields, and with great care to actually protect the analog circuits. Moreover, the traditional faraday shield is not particularly flexible.

Traditionally, an integrated circuit is supplied as part of a semiconductor package having external leads for soldering, or otherwise connecting, to a printed circuit board. For example, dual in-line packages (DIP) and surface mount leadless packages have been widely used with integrated circuit chips. In such packages, an integrated circuit chip is encapsulated in a ceramic or plastic housing having electrical leads that are suitable for soldering to a circuit board. Bonding conductors, which are also encapsulated in the housing, extend from the upper part of the electrical leads, which are within the package, to electrical pads on the integrated circuit chip. Typically, the bond conductors are welded to the external electrical connectors and to the electrical pads.

A typical prior art semiconductor package is illustrated in FIGS. 1A–1D. Referring now to FIG. 1A, that prior art package includes a lead frame 200, which is usually stamped out of a metal strip. The lead frame includes a plurality of leads 202 held together by connectors 204 that extend between rails 206. The lead frame further includes a mounting pad 208. Referring now to FIG. 1B, which shows a cut-away view along line A—A of FIG. 1A after an integrated circuit chip 210 is mounted on the mounting pad 208, bonding conductors 212 extend from exposed electrical connectors 214 on the integrated circuit chip 210 to the leads 202. Typically the bonding conductors 212 are welded to the exposed electrical connectors and to the electrical pads. Next, as shown in FIG. 1C, the lead frame 200, the integrated circuit chip 210, and the bonding conductors 212 are then encapsulated. Finally, as shown in FIG. 1D, the leads 202 are then cut and formed as required to complete the semiconductor package 220. While not specifically discussed, the rails 206 and the connectors 204 are separated from the pad 208 and the leads 202 at some time during assembly. The leads 202 enable electrical signals to travel to and from the integrated circuit chip to the external environment.

Because the dual in-line package is a relatively large structure that prevents high-density packaging, surface mount leadless packages have become popular. However, denser packaging increases the cross-talk problem. Furthermore, many analog circuits have a high impedance level that makes them particularly sensitive to crosstalk. So, while useful, most surface mount leadless packages provide inadequate electrical and electromagnetic isolation of their components.

Another type of semiconductor package, one that is a hybrid of the surface mount leadless package and the "pin" type package, is possible. Such a semiconductor package has "pins" that extend from the bottom of the package. Those pins are designed to attach to pads on the surface of a printed circuit board. As electrical connections are not made along the edges of the package, adjacent semiconductor packages can abut, which allows dense packaging. While beneficial, this also increases the cross-talk problem.

Therefore, a semiconductor package that provides electrical and electromagnetic isolation of a component mounted therein would be beneficial. More beneficial would be a semiconductor package that enables dense packaging of semiconductor components, together with electrical and electromagnetic isolation. Even more beneficial would be a low cost semiconductor package that enables dense packaging of integrated circuit chips, together with electrical and electromagnetic isolation of those chips.

SUMMARY OF THE INVENTION

Accordingly, the present invention is directed to a semiconductor package that substantially obviates one or more of the problems due to limitations and disadvantages of the related art.

The features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

The principles of the present invention provide for a semiconductor package that enables packaging of integrated circuit chips (or other semiconductor components), together with electrical and electromagnetic isolation, and that can be made available at low cost. A semiconductor package according to the principles of the present invention comprises a molded body that retains a plurality of contact pins, and that beneficially also retains an RF shield. The lower portion of the contact pins extend from the bottom of the molded body, while the upper portions of the contact pins are exposed in an interior chamber of the molded body. The RF shield is beneficially molded into the body and forms a protected cavity suitable for holding a first integrated circuit. Beneficially, bonding conductors electrically connect pads on the first integrated circuit to the tops of the contact pins. This enables electrical signals to be supplied to and from the first integrated circuit. The RF shield can be electrically grounded via a bonding conductor.

The molded body beneficially also includes an unprotected cavity for holding a second integrated circuit. The unprotected cavity beneficially includes a beveled wall nearest the protected cavity. Bonding conductors can then interconnect the first integrated circuit, the second integrated circuit, and the tops of the contact pins, as required, to enable electrical signals to flow. The bonding conductors that interconnect the first integrated circuit and the second integrated circuit are beneficially located such that they pass at a shallow angle over the beveled wall.

The molded body has top surfaces for receiving a cover, beneficially comprised of copper. Beneficially, the top surfaces are formed on an interior wall set that is separated from an exterior wall set by a channel. A sealing compound is placed in the channel, and the cover is placed on the top surfaces, thus forming a finished semiconductor package.

Beneficially, the pins are pushed into openings formed in the molded body. A sealing compound in then located over the pins to environmentally seal the semiconductor package.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Reference will now be made in detail to the preferred embodiment of the present invention, example of which is illustrated in the accompanying drawings.

The principles of the present invention are incorporated in an illustrated semiconductor package having a molded body with an internal RF shield and bottom contact pins, and multiple semiconductor chips. It will be appreciated that while the illustrated semiconductor package has enhanced properties, those that are skilled in the applicable arts will recognize numerous alternatives and variations. Therefore, the present invention is intended to extend to all alternatives and variations that come under the broad terms of the claims that follow.

Figure 1A:
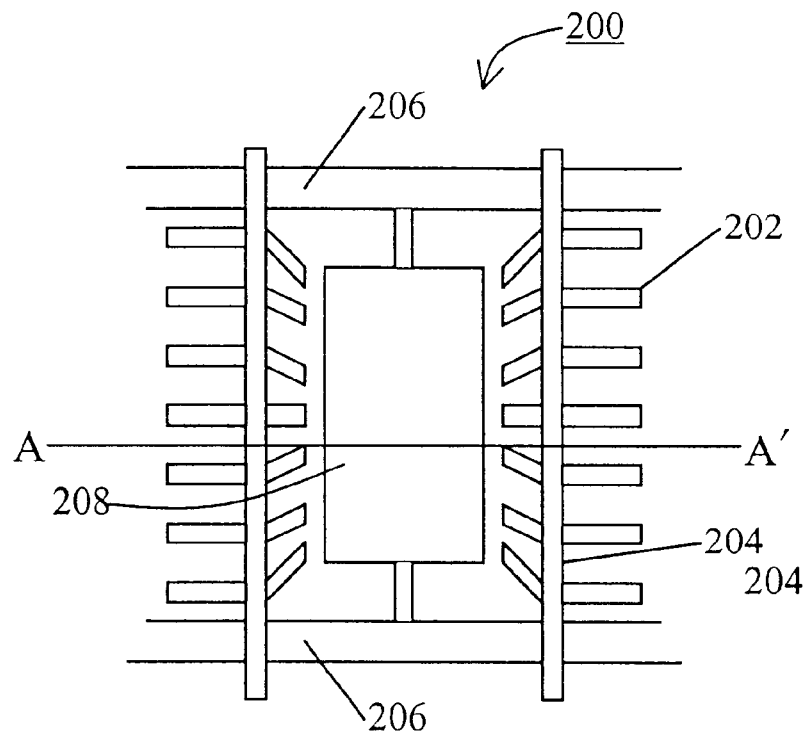
FIGS. 1A–1D illustrate a prior art semiconductor package.
Figure 1B:
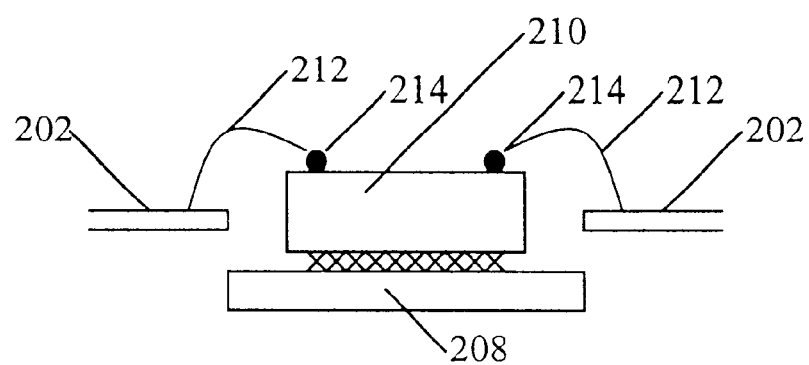
Figure 1C:
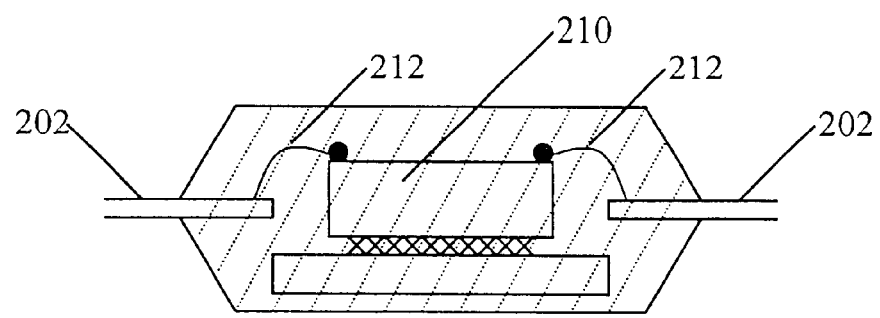
Figure 1D:
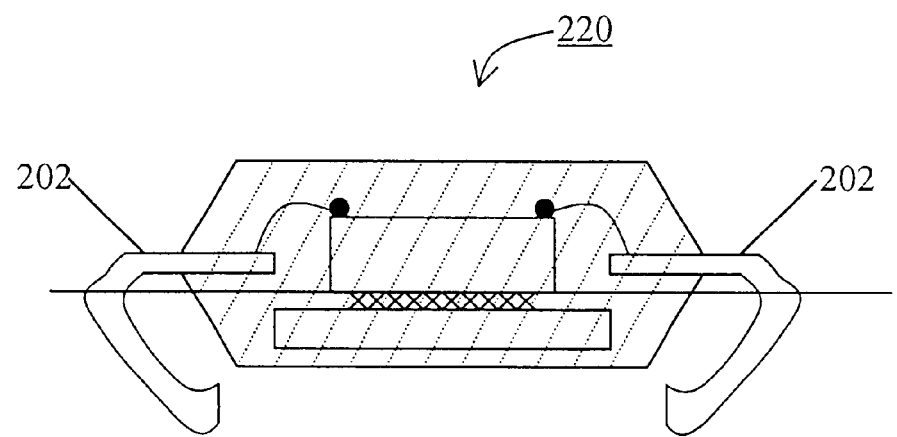
Figure 2:
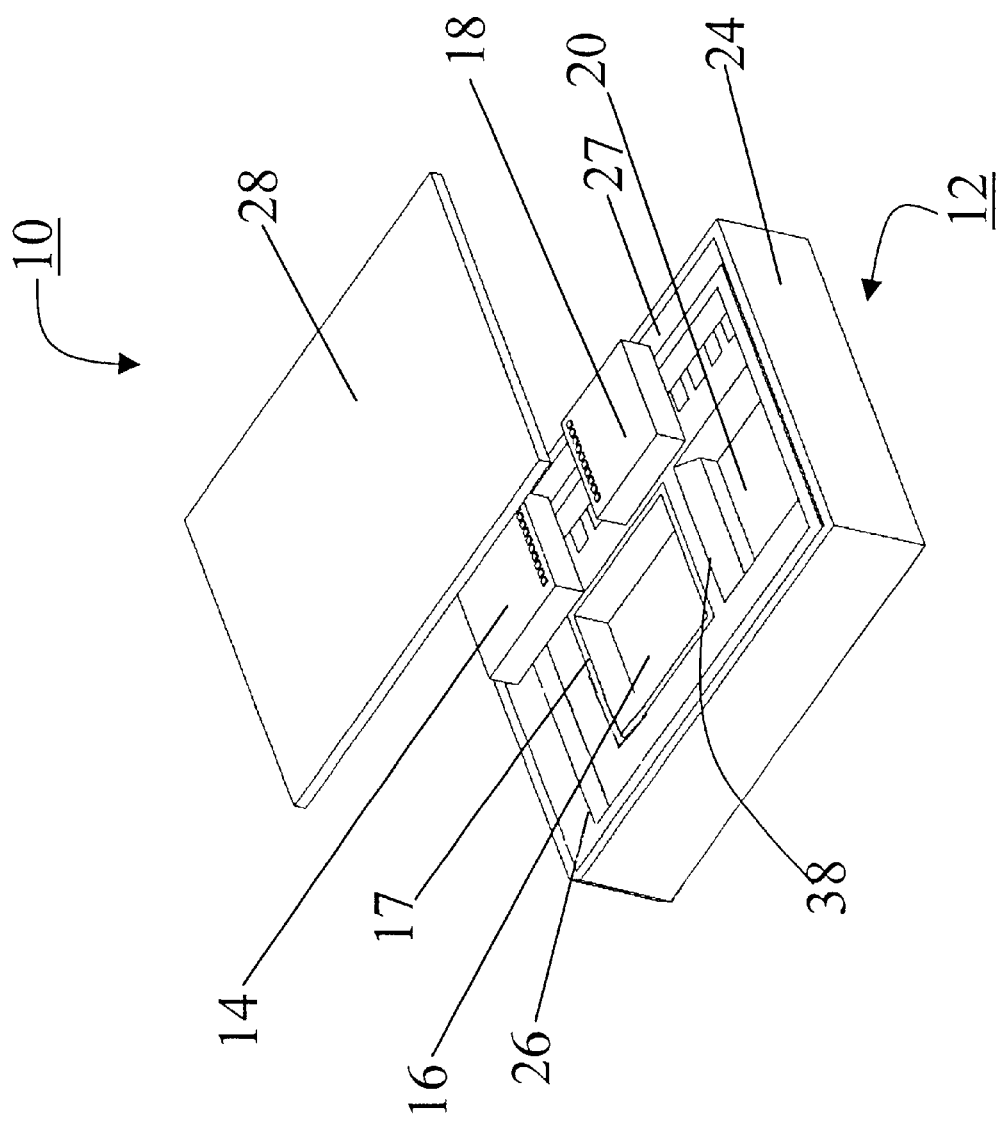
FIG. 2 is an exploded view of a semiconductor package comprised of mixed signal integrated circuits in a molded body, and that is in accord with the principles of the present invention.
Figure 4:
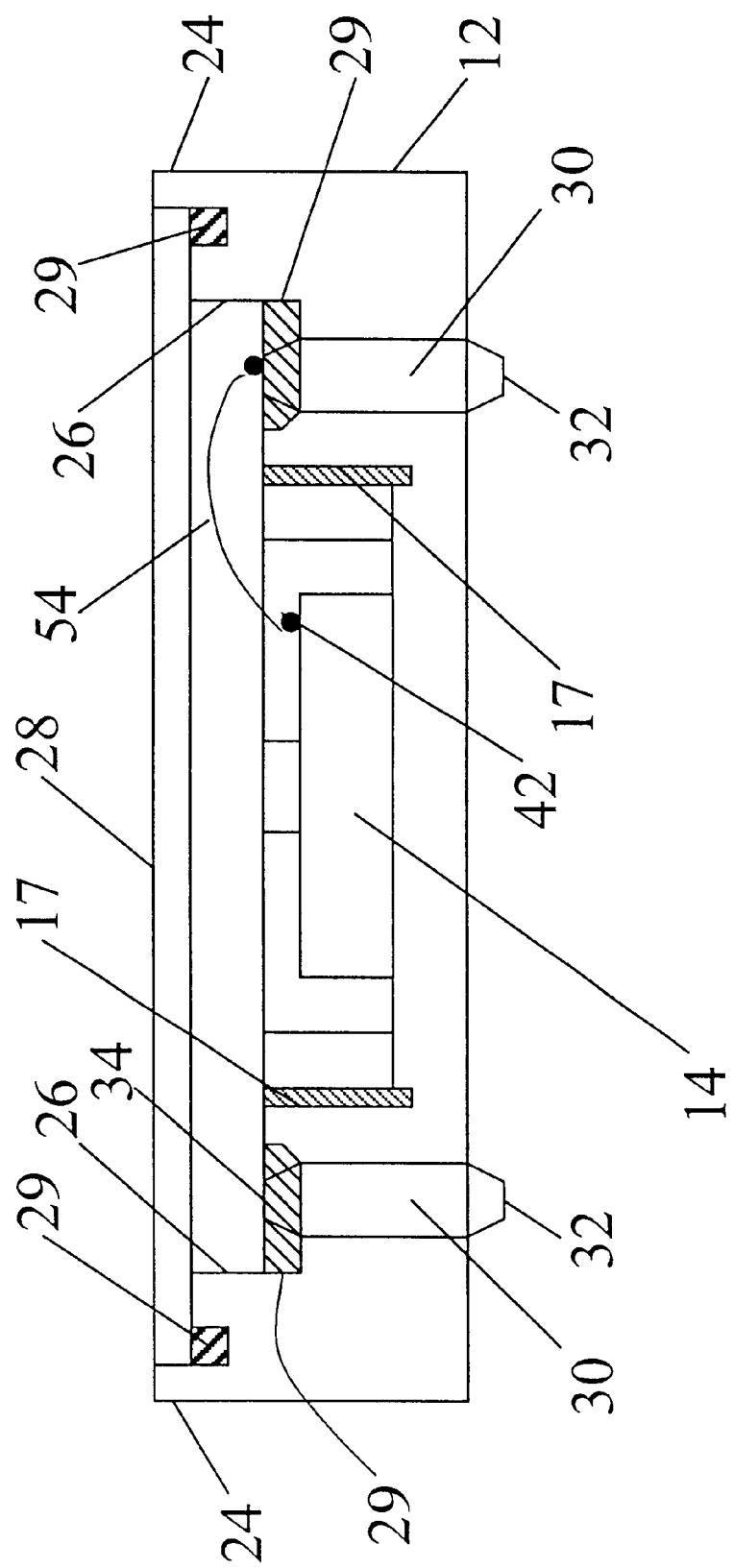
FIG. 4 is a cut-away view of the semiconductor package shown in FIG. 2, with the cut taken through the protected cavity.
Figure 5:
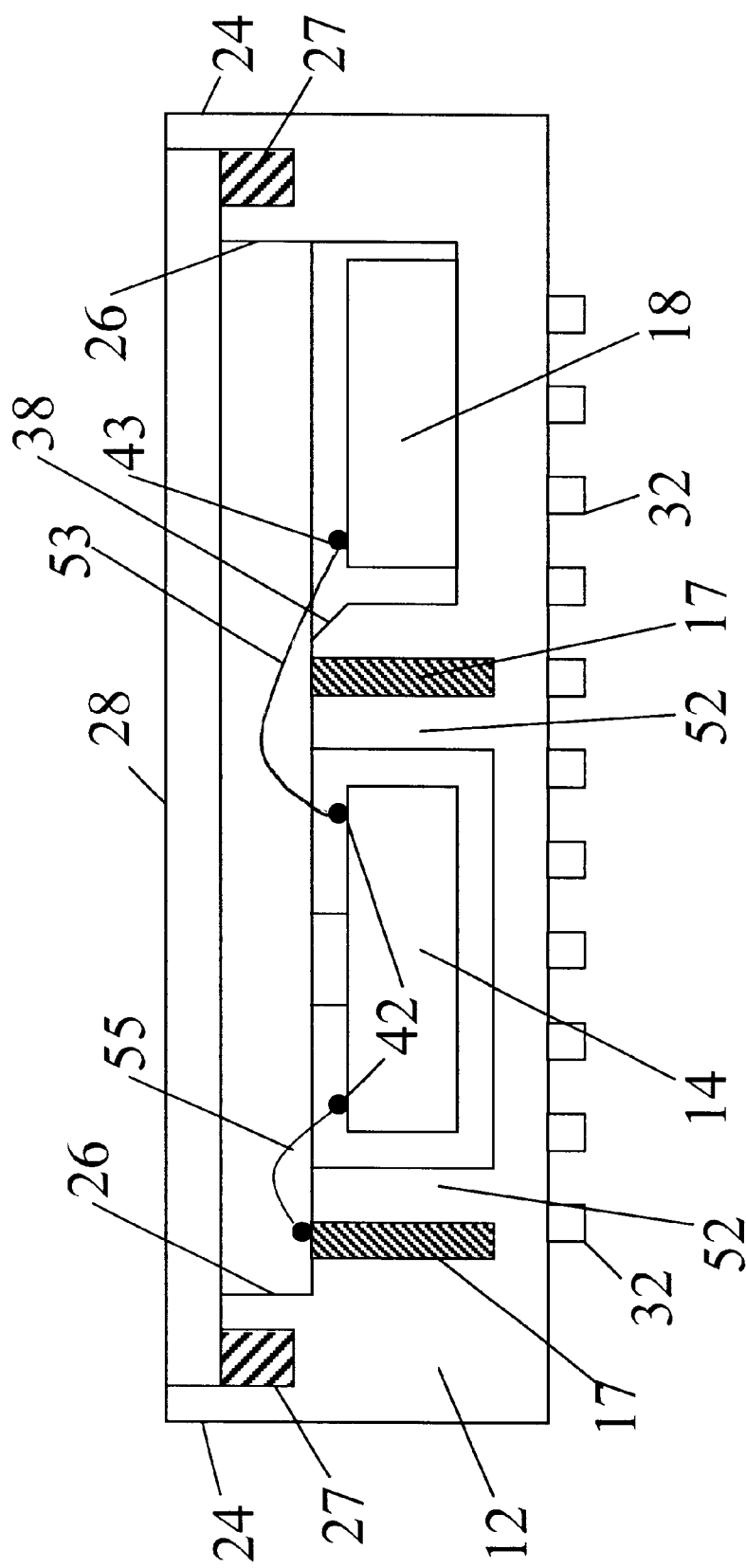
FIG. 5 is a cut-away view of the semiconductor package shown in FIG. 2, with the cut taken through both the protected cavity and the unprotected cavity.
Figure 6:
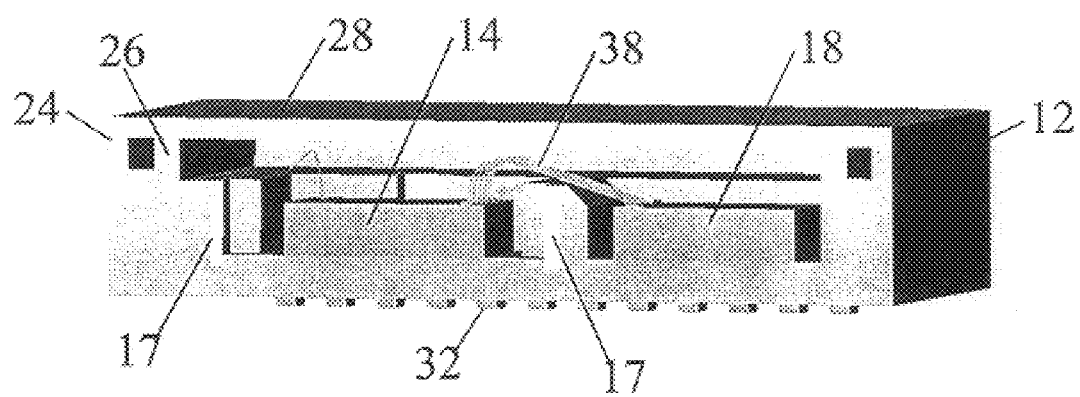
FIG. 6 is a partial cut-away view of the semiconductor package illustrated in FIG. 5.

FIG. 2 illustrates a semiconductor package 10 that is comprised of mixed signal integrated circuits in a molded body 12. A high-frequency RF analog integrated circuit 14 mounts in a protected cavity 16. The cavity 16 is surrounded by an RF shield 17, which is also shown in FIGS. 4, 5, and 6. The RF shield is comprised of a suitable shielding material and preferably comprised of copper. A high-speed digital integrated circuit 18 can be mounted in a cavity 20, which may be unprotected or unshielded. The protected or shielded cavity 16 and the unprotected cavity 20 are formed in the molded body 12, which is generally but not necessarily rectangular in shape. The RF shield is preferably located in the cavity 16. Variations of the semiconductor package 10 include having both cavities RF shielded and/or more cavities. Moreover, for some applications, both cavities may be unshielded or unprotected.

Referring to FIGS. 2 and 4–6, the molded body 12 has exterior side walls 24 and interior walls 26 that are separated by a channel 27. The exterior side walls 24 and the interior walls 26 are dimensioned to receive a conductive cover 28 that rests on the top surfaces of the interior walls 26. The cover 28 is beneficially comprised of copper. Before the cover seals the electronic assembly, a sealing compound 29, shown in FIGS. 4 and 6, is placed between the molded body 12 and the conductive cover 28 such that the sealing compound 29 locates in the channel 27. After the cover is placed on the top surfaces of the inner walls 26, the channel 27 forms a sealing trap for the sealant that collects the sealant and increases the sealing surface area.

Referring to FIG. 4, the molded body 12 retains a plurality of conductive pins 30. The pins 30 are preferably pushed through openings formed in the molded body. Alternatively, the pins can be molded in place. Referring to FIGS. 3–6, the pins 30 exit from the bottom of the molded body 12 to form electrical contacts 32. Referring to FIG. 4, the tops of the conductive pins are exposed inside the molded body 12 and act as pads 34. Beneficially, the conductive pins 30 are comprised of copper.

Referring to FIGS. 2, 5, and 6, the unprotected cavity 20 includes a beveled wall 38. The beveled wall 38 is the wall of the unprotected cavity 20 that is nearest the protected cavity 16. The beveled wall 38 is useful in locating bonding conductors 53 that electrically connect bonding pads 42 of the analog circuit 14 with bonding pads 43 of the digital circuit 18. The beveled wall 38 enables the bonding conductors 53 to pass out of the unprotected cavity 20 at a shallow angle without contacting a sharp corner. The shallow angle is beneficial in that the bonding conductors 53 do not rise so far that they interfere with the conductive cover 28. Furthermore, the beveled wall 38 avoids sharp bends as the bonding conductors 53 leave the cavity 20 and enter the cavity 16. Although not shown, the cavity 16 may also have a beveled wall to further enhance the benefits.

Referring to FIG. 4, other bonding conductors 54 are added to electrically connect the bonding pads 42 of the analog circuit 14 (or the bonding pads 43 of the digital circuit 18) to the pads 34 (which are at tops of the conductive pins 30). This enables electrical signals to be applied to and from the analog circuit 14 and the digital circuit 18 via the conductive pins 30.

The bonding conductors 53 and 54 are beneficially short and maintain generally parallel configurations with each other. This minimizes parasitic capacitance and reflections. The bonding conductors may be wires or ribbons.

In the semiconductor package 10, the analog integrated circuit 14 is shielded from interference such as from noise and crosstalk usually from the adjacent digital circuit 18 by the RF shield 17 and by the conductive cover 28. Referring to FIG. 5, if desired, a bonding conductor 55 can connect the RF shield 17 to a bonding pad 42, which can then apply an electrical ground to the RF shield 17. Furthermore, the semiconductor package 10 can be located over a ground plane on a printed circuit board to further isolate the analog circuit 14. Referring to FIG. 4, a sealant 29 can be applied along the pads 34 to seal the semiconductor package 10 and to protect the bonding conductors.

Figure 3:
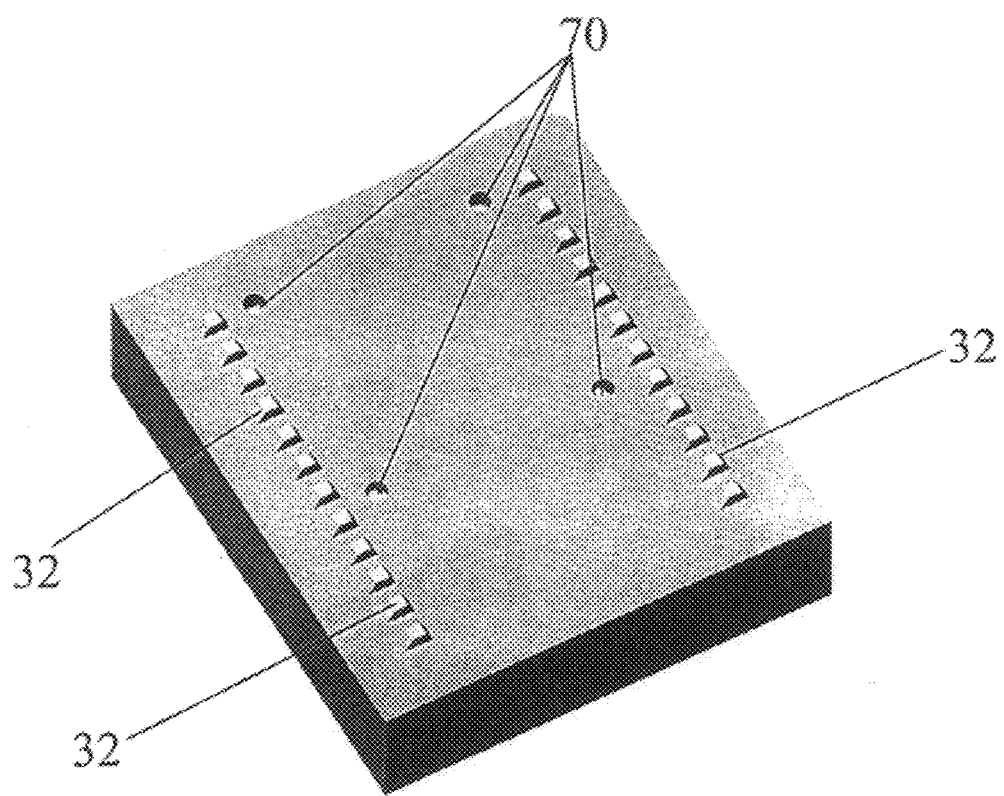
FIG. 3 is bottom perspective view of the semiconductor package illustrated in FIG. 2.

The RF shield 17 can be molded into the molded body 22. During the molding process, the RF shield 17 is located in a die region. At that time, the RF shield 17 has standoff legs that support the RF shield in the die region before molding. Turning now to FIG. 3, after molding, the standoff legs are drilled way, leaving drill holes 70. Those drill holes can be filled with sealant, if required.

Alternatively, referring to FIG. 5, the RF shield 17 can be comprised of conductive plates pushed into slots molded into the molded body 12. This can leave plastic walls 52 between the cavity 16 and the RF shield 17.

Figure 7:
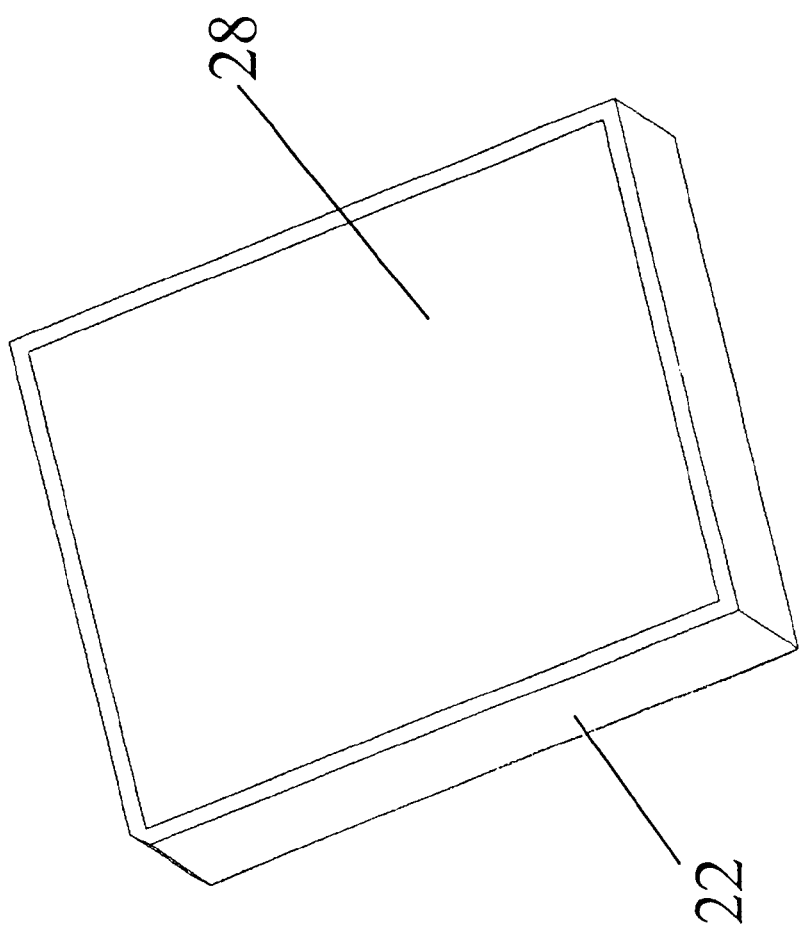
FIG. 7 is a partial cut-away, perspective view of the assembled semiconductor package shown in FIG. 2.

FIG. 7 shows a partial cut-away, perspective view of the assembled semiconductor package shown in FIG. 2. Referring to FIG. 7, the molded body 22 and cover 28 form an enclosure. The cover 28 is preferably formed of a conductive material.

The foregoing has described a semiconductor package that includes a molded body having an internal RF shield and bottom contact pins, and a plurality of integrated circuits located in cavities of the molded body. Such a semiconductor package is useful for mounting and electrically isolating integrated circuits so as to provide various mechanical, electrical, and fabrication advantages. Furthermore, a general procedure for making and using the semiconductor package has been described. However, those who are skilled in the applicable arts will recognize numerous additions, variations, and modifications to the described package apparatus and its fabrication. Therefore, it is to be understood that even though numerous characteristics and advantages of the invention have been set forth, or may become obvious to those skilled in the applicable arts, the disclosure is illustrative only and that changes may be made in details. Therefore, the present invention is meant to cover all embodiments that fall within the broad meaning of the following claims.

What is claimed is:

1. A leadless semiconductor package, comprising:
   a body having a bottom, exterior walls, interior walls, and a first cavity;
   an integrated circuit chip mounted on a side of said first cavity;
   a plurality of conductive pins retained in said body, said plurality of conductive pins extending from said bottom of said body to form a plurality of electrical contacts, said conductive pins including a plurality of pads within said body; and
   a shield within said body and surrounding said cavity.

2. A leadless semiconductor package according to claim 1, further comprising a cover over said body.

3. A leadless semiconductor package according to claim 1, further comprising a channel between said exterior walls and said interior walls.

4. A leadless semiconductor package according to claim 3, further comprising a cover on top surfaces of said interior walls.

5. A leadless semiconductor package according to claim 4, further comprising a sealant in said channel and contacting said cover.

6. A leadless semiconductor package of claim 1, wherein said body further includes a second cavity.

7. A leadless semiconductor package according to claim 6, wherein said second cavity is unprotected.

8. A leadless semiconductor package according to claim 6, wherein said second cavity has a beveled wall.

9. A leadless semiconductor package according to claim 6, wherein the first cavity includes a shield.

10. A leadless semiconductor package according to claim 1, further comprising a cover having copper.

11. A leadless semiconductor package according to claim 1, wherein said plurality of conductive pins include copper.

12. A leadless semiconductor package according to claim 1, further comprising a sealant on said conductive pins.

13. A leadless semiconductor package, including:
    a molded body having a bottom, exterior walls, interior walls, and a cavity;
    a plurality of conductive pins retained in said molded body, said plurality of conductive pins extending from the bottom of said molded body to form a plurality of external electrical contacts, said elongated conductive pins further forming a plurality of pads within said molded body;
    a conductive RF shield retained in said molded body and surrounding said cavity;
    a first integrated circuit on a surface of said cavity; and
    a cover over said molded body.

14. A leadless semiconductor package according to claim 13, further including a channel between said exterior walls and said interior walls.

15. A leadless semiconductor package according to claim 14, wherein said cover rests on tops of said interior walls.

16. A leadless semiconductor package according to claim 15, further including a sealant in said channel and contacting said cover.

17. A leadless semiconductor package according to claim 13, wherein said molded body further includes an unprotected cavity.

18. A leadless semiconductor package according to claim 17, further including a second integrated circuit in said unprotected cavity.

19. A leadless semiconductor package according to claim 18, further including a first bonding connector electrically connecting said second integrated circuit to said first integrated circuit.

20. A leadless semiconductor package according to claim 19, further including a second bonding connector electrically connecting said first integrated circuit to a pad.

21. A leadless semiconductor package according to claim 19, wherein said RF shield is electrically grounded.

22. A leadless semiconductor package according to claim 13, wherein said first integrated circuit includes analog circuits.

23. A leadless semiconductor package according to claim 18, wherein said second integrated circuit includes a digital circuit.

24. A leadless semiconductor package according to claim 18, wherein said unprotected cavity has a beveled wall.

25. A leadless semiconductor package according to claim 13, wherein said cover include copper.

26. A leadless semiconductor package according to claim 13, wherein said plurality of conductive pins include copper.

27. A leadless semiconductor package according to claim 13, wherein said plurality of conductive pins are pushed through said molded body.

28. A leadless semiconductor package according to claim 13, further including sealant over said pads.

29. A leadless semiconductor package according to claim 13, wherein said RF shield is comprised of conductive plates.

30. A leadless semiconductor package according to claim 13, wherein said RF shield is inserted into slots of said molded body.

31. A leadless semiconductor package, including:
    a molded body having a bottom, exterior walls, interior walls, a first cavity, and a second cavity;
    a plurality of conductive pins retained in said molded body, said plurality of conductive pins extending from the bottom of said molded body to form a plurality of external electrical contacts, said elongated conductive pins further forming a plurality of pads within said molded body;

a first integrated circuit on a surface of said first cavity;

a second integrated circuit in said second cavity; and a cover over said molded body.

32. A leadless semiconductor package according to claim 31, further including a channel between said exterior walls and said interior walls.

33. A leadless semiconductor package according to claim 32, wherein said cover rests on tops of said interior walls.

34. A leadless semiconductor package according to claim 33, further including a sealant in said channel and contacting said cover.

35. A leadless semiconductor package according to claim 31, further including a first bonding connector electrically connecting said second integrated circuit to said first integrated circuit.

36. A leadless semiconductor package according to claim 35, further including a second bonding connector electrically connecting said first integrated circuit to a pad.

37. A leadless semiconductor package according to claim 31, wherein said first integrated circuit includes analog circuits.

38. A leadless semiconductor package according to claim 31, wherein said second integrated circuit includes a digital circuit.

39. A leadless semiconductor package according to claim 31, wherein said second cavity has a beveled wall.

40. A leadless semiconductor package according to claim 31, wherein said cover include copper.

41. A leadless semiconductor package according to claim 31, wherein said plurality of conductive pins include copper.

42. A leadless semiconductor package according to claim 31, wherein said plurality of conductive pins are pushed through said molded body.

43. A leadless semiconductor package according to claim 31, further including sealant over said pads.

44. A leadless semiconductor package according to claim 31, further including a conductive RF shield surrounding said first cavity.

45. A leadless semiconductor package according to claim 44, wherein said RF shield is electrically grounded.

46. A leadless semiconductor package according to claim 44, wherein said RF shield is comprised of conductive plates.

47. A leadless semiconductor package according to claim 46, wherein said RF shield is inserted into slots of said molded body.

* * * * *